United States Patent
Omer et al.

(10) Patent No.: US 9,362,894 B1
(45) Date of Patent: Jun. 7, 2016

(54) CLOCK GENERATOR CIRCUIT

(71) Applicants: Ateet Omer, Kanpur (IN); Deependra K. Jain, Noida (IN); Anand Kumar Sinha, Noida (IN); Krishna Thakur, Noida (IN)

(72) Inventors: Ateet Omer, Kanpur (IN); Deependra K. Jain, Noida (IN); Anand Kumar Sinha, Noida (IN); Krishna Thakur, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/702,776

(22) Filed: May 4, 2015

(51) Int. Cl.
  *H03K 3/00* (2006.01)
  *H03K 3/012* (2006.01)
  *H03K 5/24* (2006.01)
  *H03K 5/156* (2006.01)

(52) U.S. Cl.
  CPC ............ *H03K 3/012* (2013.01); *H03K 5/1565* (2013.01); *H03K 5/24* (2013.01)

(58) Field of Classification Search
  USPC .............. 327/165, 166, 291–299, 374, 178; 326/93–98; 716/6
  See application file for complete search history.

(56) References Cited

U.S. PATENT DOCUMENTS

| | | | |
|---|---|---|---|
| 5,760,629 A * | 6/1998 | Urabe | H03F 1/30 327/307 |
| 5,805,027 A | 9/1998 | Yin | |
| 6,028,491 A | 2/2000 | Stanchak et al. | |
| 7,057,468 B2 | 6/2006 | Wu | |
| 7,138,881 B2 | 11/2006 | Lin | |
| 7,570,035 B2 * | 8/2009 | Kleveland | G05F 1/575 323/273 |
| 8,120,439 B2 | 2/2012 | Shrivastava et al. | |
| 8,536,900 B2 * | 9/2013 | Huang | G01R 19/16552 327/143 |
| 2001/0040472 A1 * | 11/2001 | Suga | G06F 1/04 327/156 |
| 2003/0122605 A1 | 7/2003 | Ulrick | |
| 2003/0160641 A1 * | 8/2003 | Starr | H03L 7/0896 327/156 |
| 2006/0087483 A1 * | 4/2006 | Takada | G09G 3/3688 345/89 |
| 2008/0150497 A1 * | 6/2008 | Matano | G05F 1/465 323/234 |
| 2008/0204438 A1 * | 8/2008 | Song | G09G 3/3225 345/207 |
| 2009/0195432 A1 * | 8/2009 | Bailey | H03M 1/146 341/156 |
| 2009/0212850 A1 * | 8/2009 | Aipperspach | G11C 29/02 327/525 |
| 2009/0261862 A1 * | 10/2009 | Nguyen | G01R 19/16552 327/73 |
| 2010/0264828 A1 * | 10/2010 | Cortigiani | H05B 33/0887 315/130 |
| 2011/0148533 A1 | 6/2011 | Ramet | |
| 2013/0002325 A1 * | 1/2013 | Lee | H03K 3/356139 327/198 |

* cited by examiner

*Primary Examiner* — Brandon S Cole
(74) *Attorney, Agent, or Firm* — Charles E. Bergere

(57) ABSTRACT

A clock generator includes a diagnostic circuit that includes first and second muxes, first and second comparators, a logic gate, and a counter. The first mux receives first and second voltage signals and outputs a first intermediate signal based on a control signal. The second mux receives third and fourth voltage signals and outputs a second intermediate signal based on the control signal. The first and second comparators compare the intermediate signals with a first signal that is indicative of a DC value of the clock signal for generating first and second comparison signals. The logic gate receives the first and second intermediate signals and generates a control signal. The counter receives the clock signal and the control signal and generates a clock ready signal that is indicative of stability and quality of the clock signal.

19 Claims, 4 Drawing Sheets

CLOCK GENERATOR CIRCUIT

BACKGROUND

The present invention generally relates to clock generator circuits, and, more particularly, to a diagnostic circuit in a clock generator circuit.

Integrated circuits (ICs) include various internal circuit modules and circuitry such as data converters, processors, flip-flops, and latches. The circuits and modules exchange signals such as control and data signals. For proper operation, the exchange of signals must be synchronized. Hence, the IC includes a clock generator circuit that generates clock signals to synchronize the exchange of signals. In some cases, an external clock generator may be connected to the IC to generate and provide the clock signals.

Conventional clock generator circuits include an oscillator circuit such as a Pierce crystal oscillator circuit, a Wien bridge oscillator circuit, and a Colpitts oscillator circuit. Such oscillator circuits include an oscillation source such as a piezoelectric crystal for generating an oscillating signal and an amplifier for receiving the oscillating signal and generating an amplified signal. The clock generator circuits further include a shaping circuit such as a Schmitt trigger or a comparator for receiving the amplified signal and generating a clock signal.

For proper operation, the clock signal must be stable and parameters of the characteristics of the clock signal such as duty cycle, frequency, and amplitude must be greater than their respective threshold values. Hence, to ensure that the parameters of the clock signal exceed the respective threshold values, the clock generator circuit includes a counter to count up to a predetermined value before generating a clock ready signal. This predetermined count value ensures that sufficient time is provided for the clock generator circuit to generate a stable clock signal.

However, for a given resonant frequency of the oscillating signal, the time required for the parameters of the clock signal to exceed their respective threshold values varies due to on-chip variations (OCV) such as process, voltage, and temperature (PVT) variations, as well as board parasitics. Hence, the predetermined count value is selected such that the parameters of the clock signal exceed the respective threshold values even under worst-case PVT conditions. Thus, the clock ready signal is generated after a predetermined time period even though the parameters of the clock signal may exceed their respective threshold values before the predetermined time period, thereby resulting in a long start-up time.

A known technique to improve the start-up time is to use a diagnostic circuit. FIG. 1 is a schematic block diagram of a conventional clock generator circuit 100. The clock generator circuit 100 includes an oscillator circuit 102, a shaping circuit 104, and a diagnostic circuit 106. The oscillator circuit 102 may be a Pierce crystal oscillator circuit and include a first amplifier circuit 108, a first oscillation source 110, a first resistor 112, and first and second capacitors 114 and 116. The first oscillation source 110 is a piezoelectric crystal and the first amplifier circuit 108 is an inverting amplifier circuit.

The first oscillation source 110 is connected between input and output terminals of the first amplifier circuit 108. The first oscillation source 110 generates a first oscillating signal ($V_{OSC\_1}$). The first amplifier circuit 108 receives the first oscillating signal ($V_{OSC\_1}$) at its input terminal and generates a first amplified signal ($V_{AMP\_1}$) at its output terminal.

The first resistor 112 is connected between the input and output terminals of the first amplifier circuit 108 and provides a direct current (DC) operation bias of the first amplifier circuit 108.

The first capacitor 114 is connected between the input terminal of the first amplifier circuit 108 and ground. The second capacitor 116 is connected between the output terminal of the first amplifier circuit 108 and ground. The first and second capacitors 114 and 116 are selected such that the first oscillation source 110 has a parallel resonant frequency close to its series resonant frequency. The first amplifier circuit 108 generates the first amplified signal ($V_{AMP\_1}$) at a frequency that is between the series and parallel resonant frequencies of the first oscillation source 110. The first amplifier circuit 108, and the first oscillation source 110 and the first and second capacitors 114 and 116 cause the first amplified signal ($V_{AMP\_1}$) to undergo a phase shift that is a multiple of 360 degrees.

The shaping circuit 104 comprises a first Schmitt trigger and is connected to the output terminal of the first amplifier circuit 108 for receiving the first amplified signal ($V_{AMP\_1}$) and generating an intermediate clock signal ($V_{INT\_CLK}$).

The diagnostic circuit 106 includes a hysteresis circuit 118 and an AND gate 120. The hysteresis circuit 118 has a hysteresis voltage greater than a hysteresis voltage of the shaping circuit 104. The hysteresis circuit 118 is connected to the output terminal of the first amplifier circuit 108 for receiving the first amplified signal ($V_{AMP\_1}$) and generating a clock ready signal ($V_{CLK\_RDY}$). The hysteresis circuit 118 generates a high clock ready signal ($V_{CLK\_RDY}$) when the amplitude of the first amplified signal ($V_{AMP\_1}$) is greater than a first threshold value or less than a second threshold value. For example, the first threshold value may be 75% of a full swing voltage and the second threshold value may be 25% of the full swing voltage.

The AND gate 120 has first and second input terminals connected to the shaping circuit 104 and the hysteresis circuit 118 for receiving the intermediate clock signal ($V_{CLK\_INT}$) and the clock ready signal ($V_{CLK\_RDY}$), respectively. The AND gate 120 has an output terminal for generating a first clock signal ($V_{CLK\_1}$). The AND gate 120 generates the first clock signal ($V_{CLK\_1}$) signal only when the hysteresis circuit 118 enables the clock ready signal ($V_{CLK\_RDY}$). Thus, the first clock generator circuit 100 provides the first clock signal ($V_{CLK\_1}$) when the clock ready signal ($V_{CLK\_RDY}$) is enabled by the hysteresis circuit 118.

The diagnostic circuit 106 determines whether the amplitude of the first amplified signal ($V_{AMP\_1}$) is greater than the first threshold value or less than the second threshold values. However, the diagnostic circuit 106 does not determine whether the duty cycle of the intermediate clock signal ($V_{INT\_CLK}$) is within respective predefined threshold values. Thus, the duty cycle of the intermediate clock signal ($V_{INT\_CLK}$) may not lie within respective predefined threshold values and hence, the duty cycle of the first clock signal ($V_{CLK\_1}$) also may not be within respective predefined threshold values. Further, the common mode voltage of the first amplified signal ($V_{AMP\_1}$) varies with properties of the first oscillation source 110 and also due to PVT variations. Therefore, the hysteresis circuit 118 does not efficiently adjust the clock ready signal ($V_{CLK\_RDY}$) per the variations in the common mode voltage of the first amplified signal ($V_{AMP\_1}$). Hence, the above technique may not provide the first clock signal ($V_{CLK\_1}$) with the parameters such as duty cycle within the required limits.

FIG. 2 is a schematic block diagram of another conventional clock generator circuit 200. The clock generator circuit 200 generates a stable clock signal with a fast start-up time. The second clock generator circuit 200 includes an oscillator circuit 202, second and third Schmitt triggers 204 and 206, and amplifier switch logic 208.

The oscillator circuit 202 includes second, third, and fourth amplifier circuits 210, 212, and 214, a second oscillation source 216, a second resistor 218, and third and fourth capacitors 220 and 222. The second amplifier circuit 210, the second oscillation source 216, the second resistor 218, and the third and fourth capacitors 220 and 220 form a Pierce crystal oscillator circuit that is structurally and functionally similar to the first oscillator circuit 102. The second, third, and fourth amplifier circuits 210, 212, and 214 are inverting amplifier circuits. The third and fourth amplifier circuits 212 and 214 have input and output terminals connected to input and output terminals of the second amplifier circuit 210. The second, third, and fourth amplifier circuits 210, 212, and 214 form an amplifier set 224. The amplifier set 224 acts as an amplifier circuit having an amplification factor equal to the sum of amplification factors of the second, third, and fourth amplifier circuits 210, 212, and 214.

The second oscillation source 216 generates a second oscillating signal ($V_{OSC\_2}$). The amplifier set 224 is connected to the second oscillation source 216 for receiving the second oscillating signal ($V_{OSC\_2}$) and generating a second amplified signal ($V_{AMP\_2}$).

The second Schmitt trigger 204 is connected to the amplifier set 224 for receiving the second amplified signal ($V_{AMP\_2}$) and generating an intermediate signal ($V_{INT}$) that is indicative of the amplitude of a second clock signal ($V_{CLK\_2}$). The second Schmitt trigger 204 has a first hysteresis voltage.

The third Schmitt trigger 206 is connected to the amplifier set 224 for receiving the second amplified signal ($V_{AMP\_2}$) and generating the second clock signal ($V_{CLK\_2}$). The third Schmitt trigger 206 has a second hysteresis voltage that is less than the first hysteresis voltage.

The amplifier switch logic 208 is connected to the second Schmitt trigger 204 for receiving the intermediate signal ($V_{INT}$). The amplifier switch logic 208 generates and provides first, second, and third switch signals ($V_{SW\_1}$, $V_{SW\_2}$, and $V_{SW\_3}$, respectively) to the second, third, and fourth amplifier circuits 210, 212, and 214. The first, second, and third switch signals ($V_{SW\_1}$, $V_{SW\_2}$, and $V_{SW\_3}$, respectively) are indicative of switching on or switching off the second, third, and fourth amplifier circuits 210, 212, and 214, respectively. For example, the first, second, and third switch signals ($V_{SW\_1}$, $V_{SW\_2}$, and $V_{SW\_3}$, respectively) may be enabled to switch off the second, third, and fourth amplifier circuits 210, 212, and 214, respectively, while the first, second, and third switch signals ($V_{SW\_1}$, $V_{SW\_2}$, and $V_{SW\_3}$, respectively) may be disabled to switch on the second, third, and fourth amplifier circuits 210, 212, and 214, respectively. In FIG. 2, the amplifier switch logic 208 is an N-bit counter that counts the pulses of the intermediate signal ($V_{INT}$).

When the power to the second clock generator circuit 200 is applied, the second, third, and fourth amplifier circuits 210, 212, and 214 are switched on, thereby increasing the amplitude of the second amplified signal ($V_{AMP\_2}$) in a short period of time. As the voltage level of the second amplified signal ($V_{AMP\_2}$) is greater than the second hysteresis voltage, the third Schmitt trigger 206 generates and provides the second clock signal ($V_{CLK\_2}$) to electronic circuits of an IC connected to the second clock generator circuit 200. Thus, the amplifier set 224 helps in achieving a fast start-up time.

The amplifier switch logic 208 counts the pulses of the intermediate signal ($V_{INT}$) and switches off one amplifier circuit of the amplifier set 224 each time the amplifier switch logic 208 counts up to a pre-determined count value, thereby reducing the amplification factor of the amplifier set 224. The amplifier switch logic 208 switches off the amplifier circuits of the amplifier set 224 one by one until only the second amplifier circuit 210 is on. When only the second amplifier circuit 210 is on, the amplification provided by the amplifier set 224 is not sufficient for the voltage level of the intermediate signal ($V_{INT}$) to be greater than the voltage level of the first hysteresis voltage. Hence, the second Schmitt trigger 204 does not generate the intermediate signal ($V_{INT}$) as an oscillating signal so the counting operation performed by the amplifier switch logic 208 is stopped. Thus, the logic states of the first, second, and third switch signals ($V_{SW\_1}$, $V_{SW\_2}$, and $V_{SW\_3}$, respectively) do not change. However, the amplification provided by the second amplifier circuit 210 is sufficient for the third Schmitt trigger 206 to generate and provide the second clock signal ($V_{CLK\_2}$) to the electronic circuits of the IC.

The second, third, and fourth amplifier circuits 210, 212, and 214 are switched on, when power to the clock generator circuit 200 is applied, thereby leading to power overhead. Further, the clock generator circuit 200 requires multiple amplifier circuits, two Schmitt triggers, and the amplifier switch logic for proper operation, which leads to area overhead. Furthermore, the common mode voltage of the second amplified signal ($V_{AMP\_2}$) varies with the properties of the second oscillation source 216 and also varies with PVT variations so the second and third Schmitt triggers 204 and 206 do not perform efficiently at all common mode voltages of the second amplified signal ($V_{AMP\_2}$). Also, the clock generator circuit 200 does not determine whether the duty cycle of the second clock signal ($V_{CLK\_2}$) is within required limits and hence, the second clock generator circuit 200 may provide an unstable second clock signal ($V_{CLK\_2}$) to the electronic circuits of the IC.

Therefore, it would be advantageous to have a clock generator circuit that provides a stable clock signal in a reduced time without impacting area and power overhead.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
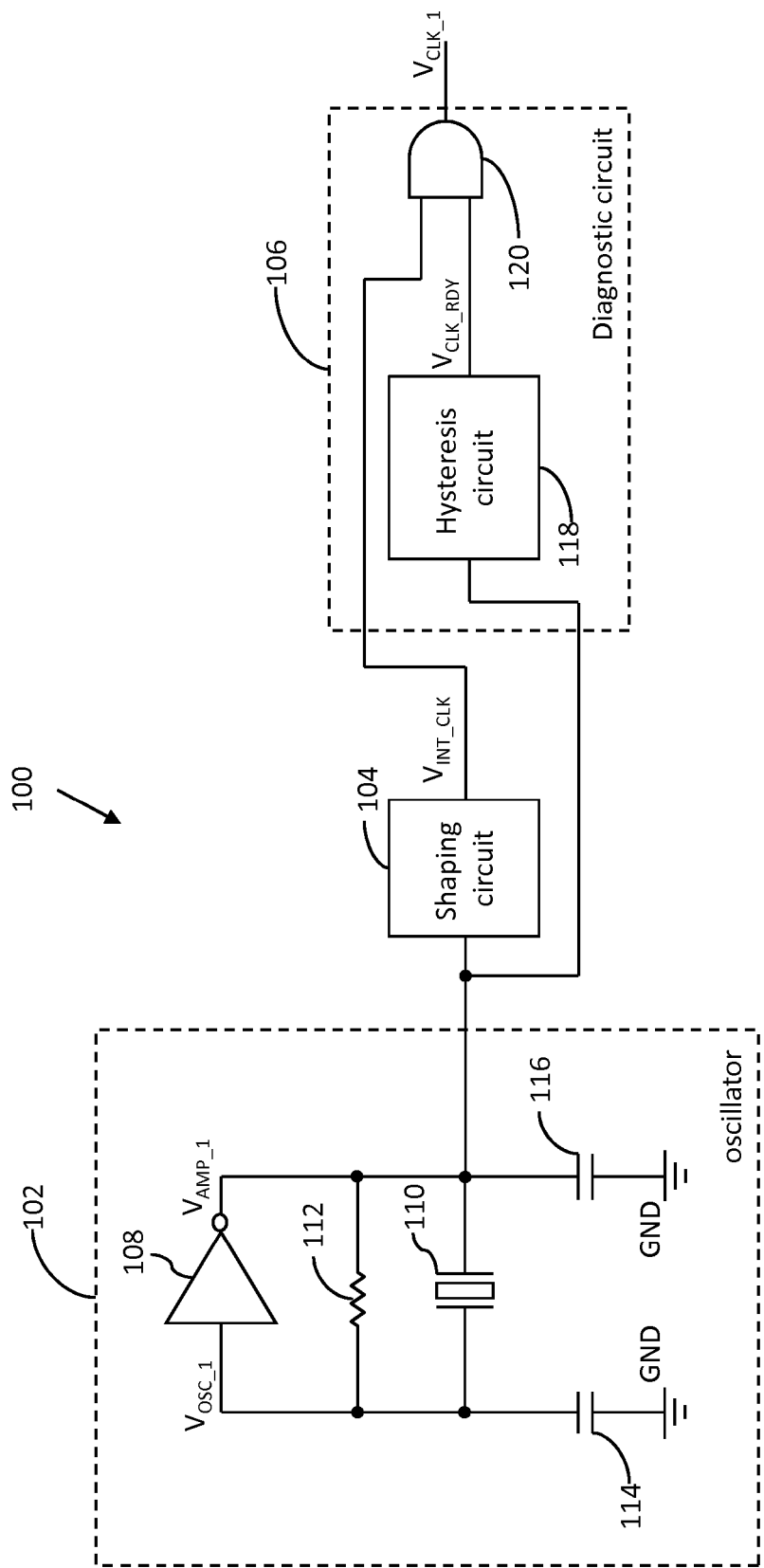
FIG. 1 is a schematic block diagram of a first conventional clock generator circuit.
Figure 2:
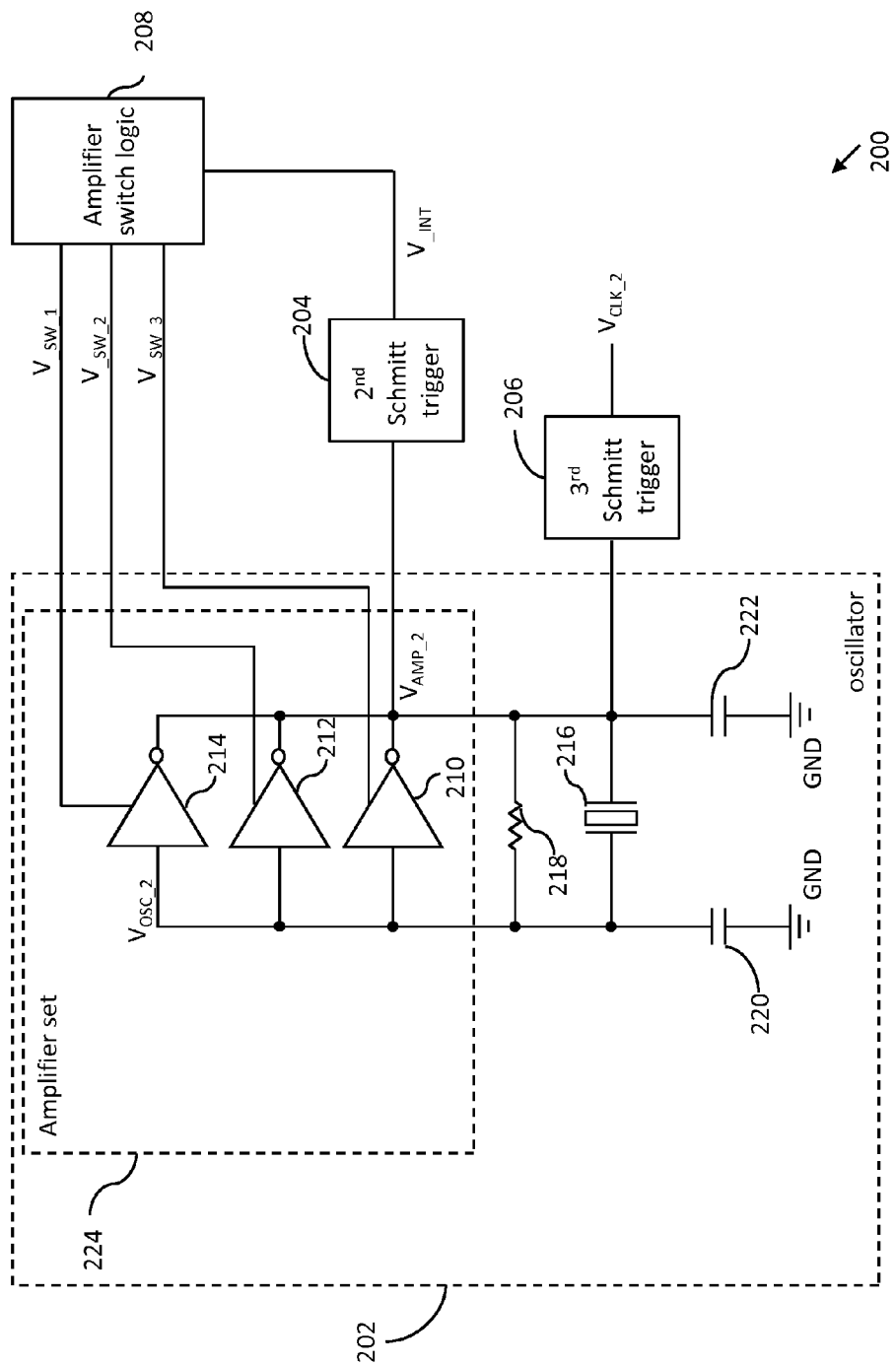
FIG. 2 is a schematic block diagram of a second conventional clock generator circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux and the term de-multiplexer has been abbreviated as a demux.

In an embodiment of the present invention, a clock generator circuit is provided. The clock generator circuit includes a resistor-ladder network, first and second multiplexers, first and second comparators, a logic gate, and a counter. The resistor-ladder network is connected between first and second supply voltages. The resistor-ladder network includes first, second, third, and fourth voltage taps for outputting first, second, third, and fourth voltage signals, respectively. The first multiplexer receives the first and second voltage signals and a control signal. The first multiplexer outputs a first intermediate signal. The second multiplexer receives the third and fourth voltage signals and the control signal. The second multiplexer outputs a second intermediate signal. The first comparator receives the first intermediate signal and a first signal. The first signal is indicative of at least one of a direct current (DC) value of a clock signal and an average value of an amplitude of the clock signal. The first comparator generates a first comparison signal. The second comparator receives the first signal and the second intermediate signal. The second comparator generates a second comparison signal. The logic gate receives the first and second comparison signals and generates the control signal. The counter receives the control signal and the clock signal. The counter generates a clock ready signal based on the control signal. The clock ready signal is indicative of the stability and the quality of the clock signal.

In another embodiment of the present invention, a clock generator circuit is provided. The clock generator circuit includes an amplifier circuit, a shaping circuit, a low pass filter, and a diagnostic circuit. The amplifier circuit receives an oscillating signal and generates an amplified signal. The shaping circuit receives the amplified signal, shapes the amplified signal, and generates a clock signal. The low pass filter receives the clock signal and generates a first signal. The first signal is indicative of at least one of a direct current (DC) value of the clock signal and an average value of an amplitude of the clock signal. The diagnostic circuit includes a resistor-ladder network, first and second multiplexers, first and second comparators, a logic gate, and a counter. The resistor-ladder network is connected between first and second supply voltages. The resistor-ladder network includes first, second, third, and fourth voltage taps for outputting first, second, third, and fourth voltage signals, respectively. The first multiplexer receives the first and second voltage signals and the control signal. The first multiplexer outputs a first intermediate signal. The second multiplexer receives the third and fourth voltage signals and the control signal. The second multiplexer outputs a second intermediate signal. The first comparator receives the first intermediate signal and the first signal. The first comparator generates a first comparison signal. The second comparator receives the first signal and the second intermediate signal. The second comparator generates a second comparison signal. The logic gate receives the first and second comparison signals and generates the control signal. The counter receives the control signal and the clock signal. The counter generates a clock ready signal based on the control signal. The clock ready signal is indicative of the stability and the quality of the clock signal.

Various embodiments of the present invention provide a clock generator circuit that includes a diagnostic circuit. The diagnostic circuit includes a resistor-ladder network, first and second multiplexers, first and second comparators, a logic gate, and a counter. The resistor ladder-network generates first through fourth voltage signals. The first multiplexer receives first and second voltage signals and generates a first intermediate signal. The second multiplexer receives the third and fourth voltage signals and generates a second intermediate signal. The first comparator receives the first intermediate signal and a first signal and generates a first comparison signal. The first signal is indicative of at least one of a direct current (DC) value of a clock signal and an average value of an amplitude of the clock signal. The second comparator receives the second intermediate signal and the first signal and generates a second comparison signal. The logic gate receives the first and second comparison signals and generates a control signal. The control signal is indicative of duty cycle of the clock signal. The counter receives the clock signal and the control signal and generates a clock ready signal that is indicative of the stability and the quality of the clock signal.

The control signal is enabled when the duty cycle of the clock signal is within predefined thresholds. Further, for ensuring the stability and quality of the clock signal, the counter counts up to a programmed count value when the control signal is at logic high state and generates the clock ready signal at logic high state. Furthermore, the clock signal is provided to electronic circuits such as flip-flops, latches, processors, and data converters of an IC only when the clock ready signal is at logic high state. Hence, other parameters corresponding to the characteristics of the clock signal such as frequency and duty cycle are also within the required predefined thresholds. Further, as the diagnostic circuit receives the first signal that is indicative of at least one of the DC value of the clock signal and the average value of the amplitude of the clock signal, the diagnostic circuit performs operations on the first signal for determining the stability and quality of the clock signal. Thus, the diagnostic circuit provides a stable clock signal that is process corner independent. Hence, it is not necessary to have a large programmed count value for the counter for ensuring the stability and quality of the clock signal, i.e., it is not necessary to have large time margins for ensuring that the clock signal is stable under all working conditions such as process-voltage-temperature (PVT) conditions. Hence, the time required to provide a stable clock signal to the electronic circuits under given working conditions is reduced, thereby reducing the start-up time of the clock generator circuit.

Figure 3:
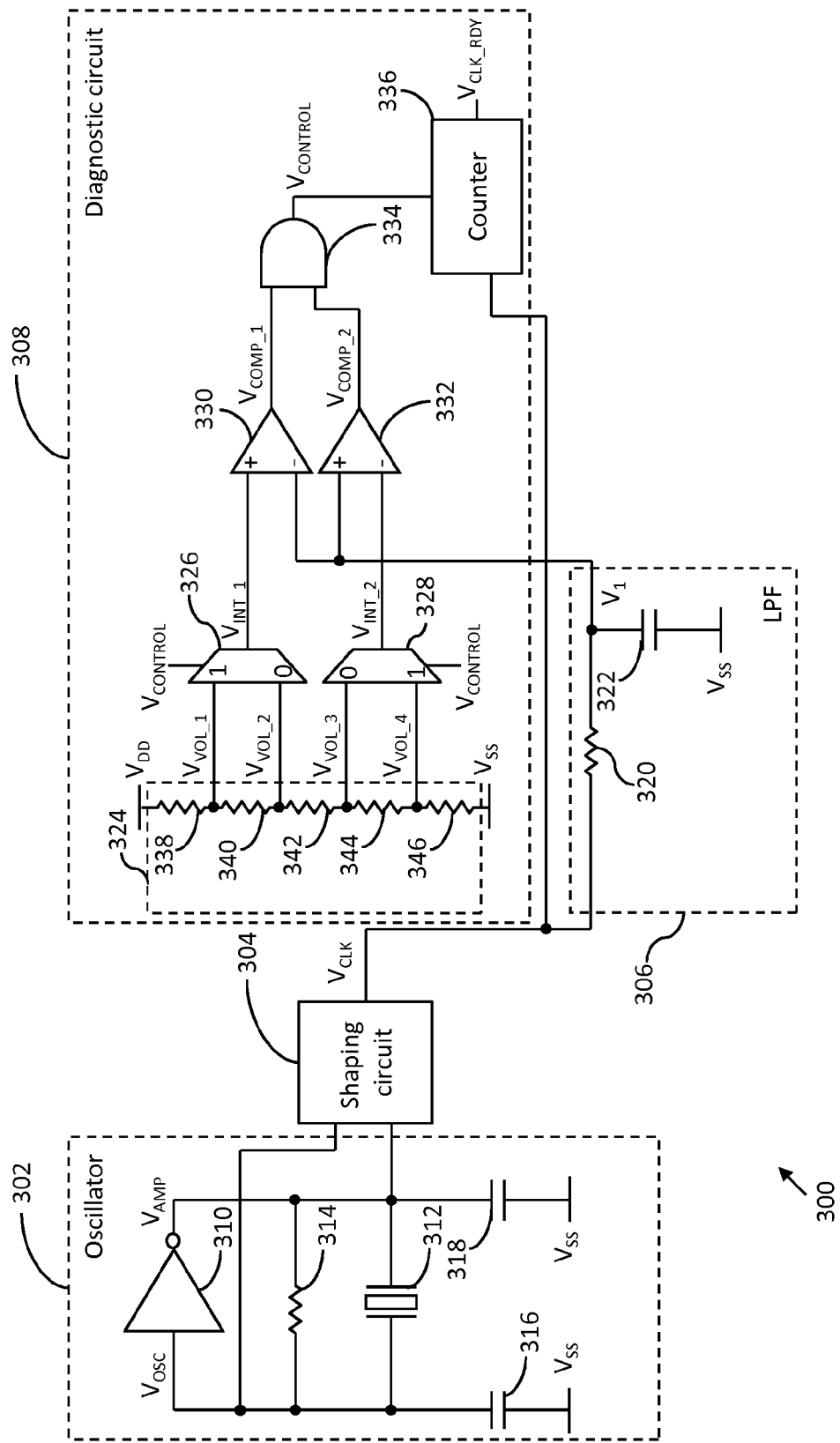
FIG. 3 is a schematic block diagram of a clock generator circuit in accordance with an embodiment of the present invention.

Referring now to FIG. 3, a schematic block diagram of a clock generator circuit 300 in accordance with an embodiment of the present invention is shown. The clock generator circuit 300 includes an oscillator circuit 302, a shaping circuit 304, a low pass filter 306, and a diagnostic circuit 308. Examples of the oscillator circuit 302 include a Pierce crystal oscillator circuit, a Wien bridge oscillator circuit, and a Colpitts oscillator circuit.

In an example, the oscillator circuit 302 is a Pierce crystal oscillator circuit. The oscillator circuit 302 includes an amplifier circuit 310, an oscillation source 312, a first resistor 314, and first and second capacitors 316 and 318. In the example, the oscillation source 312 is a piezoelectric crystal and the amplifier circuit 310 is an inverting amplifier circuit.

The oscillation source 312 is connected between input and output terminals of the amplifier circuit 310. The oscillation source 312 generates an oscillating signal ($V_{OSC}$). The amplifier circuit 310 receives the oscillating signal ($V_{OSC}$) at the input terminal thereof and generates an amplified signal ($V_{AMP}$) at the output terminal thereof.

The first resistor 314 is connected between the input and output terminals of the amplifier circuit 310. The first resistor 314 provides a direct current (DC) operation bias of the amplifier circuit 310.

The first capacitor 316 is connected between the input terminal of the amplifier circuit 310 and a first power supply (not shown) for receiving a first supply voltage ($V_{SS}$). The second capacitor 318 is connected between the output terminal of the amplifier circuit 310 and the first power supply for receiving the first supply voltage ($V_{SS}$). The first and second capacitors 316 and 318 are selected such that the oscillation source 312 has a parallel resonant frequency close to a series resonant frequency thereof. The amplifier circuit 310 generates the amplified signal ($V_{AMP}$) at a frequency that is between the series and parallel resonant frequencies of the oscillation source 312. The amplifier circuit 310, and the oscillation source 312, and the first and second capacitors 316 and 318 cause the amplified signal ($V_{AMP}$) to undergo a phase shift that is a multiple of 360 degrees.

In an embodiment of the present invention, the shaping circuit 304 is a comparator circuit having first and second input terminals connected to the oscillation source 312 and the output terminal of the amplifier circuit 310 for receiving the oscillating signal ($V_{OSC}$) and the amplified signal ($V_{AMP}$), respectively. The shaping circuit 304 compares the oscillating signal ($V_{OSC}$) and the amplified signal ($V_{AMP}$) and generates a clock signal ($V_{CLK}$) at an output terminal thereof. In another embodiment of the present invention, the shaping circuit 304 is a Schmitt trigger having an input terminal connected to the output terminal of the amplifier circuit 310 for receiving the amplified signal ($V_{AMP}$). The shaping circuit 304 shapes the amplified signal ($V_{AMP}$) and generates the clock signal ($V_{CLK}$) at an output terminal thereof. In yet another embodiment of the present invention, the shaping circuit 304 is a comparator circuit having an input terminal connected to the output terminal of the amplifier circuit 310 for receiving the amplified signal ($V_{AMP}$). The shaping circuit 304 has a second input terminal for receiving a filtered signal that is indicative of a direct current (DC) value of the amplified signal ($V_{AMP}$). The shaping circuit 304 compares the amplified signal ($V_{AMP}$) and the filtered signal and generates the clock signal ($V_{CLK}$).

In the example, the low pass filter 306 is a resistor-capacitor (RC) filter. The low pass filter 306 is connected to the output terminal of the shaping circuit 304 for receiving the clock signal ($V_{CLK}$). The low pass filter 306 generates a first signal ($V_1$) that is indicative of a DC value of the clock signal ($V_{CLK}$) or an average value of an amplitude of the clock signal ($V_{CLK}$). The low pass filter 306 includes a second resistor 320 and a third capacitor 322. The second resistor 320 and the third capacitor 322 are connected in series between the output terminal of the shaping circuit 304 and the first power supply. It will be understood by those of skill in the art that the low pass filter 306 can be an active filter.

The diagnostic circuit 308 includes a resistor-ladder network 324, first and second muxes 326 and 328, first and second comparators 330 and 332, an AND gate 334, and a counter 336.

The resistor-ladder network 324 includes third through seventh resistors 338-346 connected in series between a second power supply (not shown) for receiving a second supply voltage ($V_{DD}$) and the first power supply for receiving the first supply voltage ($V_{SS}$). In the example, the resistance values of the third through seventh resistors 338-346 are 160 kilo-ohms, 10 kilo-ohms, 60 kilo-ohms, 10 kilo-ohms, and 160 kilo-ohms, respectively. Thus, the resistance values of the third through seventh resistors 338-346 are in the ratio of 16:1:6:1:16. It will be understood by those of skill in the art that the resistance values of the third through seventh resistors 338-346 may be different for achieving the above ratio. The resistor-ladder network 324 has first, second, third, and fourth voltage taps for outputting first, second, third, and fourth voltage signals respectively ($V_{VOL\_1}$, $V_{VOL\_2}$, $V_{VOL\_3}$, and $V_{VOL\_4}$, respectively).

The first mux 326 has first and second input terminals connected to the first and second voltage taps for receiving the first and second voltage signals ($V_{VOL\_1}$ and $V_{VOL\_2}$), respectively. The first mux 326 has a select terminal for receiving a control signal ($V_{CONTROL}$) and an output terminal for outputting a first intermediate signal ($V_{INT\_1}$). The first mux 326 outputs the first voltage signal ($V_{VOL\_1}$) as the first intermediate signal ($V_{INT\_1}$) when the control signal ($V_{CONTROL}$) is at logic high state. The first mux 326 outputs the second voltage signal ($V_{VOL\_2}$) as the first intermediate signal ($V_{INT\_1}$) when the control signal ($V_{CONTROL}$) is at logic low state.

The second mux 328 has first and second input terminals connected to the fourth and third voltage taps for receiving the fourth and third voltage signals ($V_{VOL\_4}$ and $V_{VOL\_3}$), respectively. The second mux 328 has a select terminal for receiving the control signal ($V_{CONTROL}$) and an output terminal for outputting a second intermediate signal ($V_{INT\_2}$). The second mux 328 outputs the fourth voltage signal ($V_{VOL\_4}$) as the second intermediate signal ($V_{INT\_2}$) when the control signal ($V_{CONTROL}$) is at logic high state. The second mux 328 outputs the third voltage signal ($V_{VOL\_3}$) as the second intermediate signal ($V_{INT\_2}$) when the control signal ($V_{CONTROL}$) is at logic low state.

The first comparator 330 has first and second input terminals connected to the output terminal of the first mux 326 and the low pass filter 306 for receiving the first intermediate signal ($V_{INT\_1}$) and the first signal ($V_1$), respectively. The first comparator 330 has an output terminal for generating a first comparison signal ($V_{COMP\_1}$). The first comparator 330 generates the first comparison signal ($V_{COMP\_1}$) at logic high state when a voltage level of the first intermediate signal ($V_{INT\_1}$) is greater than a voltage level of the first signal ($V_1$). The first comparator 330 generates the first comparison signal ($V_{COMP\_1}$) at logic low state when the voltage level of the first intermediate signal ($V_{INT\_1}$) is less than the voltage level of the first signal ($V_1$).

The second comparator 332 has first and second input terminals connected to the low pass filter 306 and the output terminal of the second mux 328 for receiving the first signal ($V_1$) and the second intermediate signal ($V_{INT\_2}$), respectively.

The second comparator 332 has an output terminal for generating a second comparison signal ($V_{COMP\_2}$). The second comparator 332 generates the second comparison signal ($V_{COMP\_2}$) at logic high state when a voltage level of the second intermediate signal ($V_{INT\_2}$) is less than a voltage level of the first signal ($V_1$). The second comparator 332 generates the second comparison signal ($V_{COMP\_2}$) at logic low state when the voltage level of the second intermediate signal ($V_{INT\_2}$) is greater than the voltage level of the first signal ($V_1$).

The AND gate 334 has first and second input terminals connected to the first and second comparators 330 and 332 for receiving the first and second comparison signals ($V_{COMP\_1}$ and $V_{COMP\_2}$), respectively. The AND gate 334 has an output terminal for generating the control signal ($V_{CONTROL}$). The control signal ($V_{CONTROL}$) is indicative of duty cycle of the clock signal ($V_{CLK}$). A logic high control signal ($V_{CONTROL}$) indicates that the duty cycle of the clock signal ($V_{CLK}$) is within required limits. The AND gate 334 generates the control signal ($V_{CONTROL}$) at logic high state when the first and second comparison signals ($V_{COMP\_1}$ and $V_{COMP\_2}$) are at logic high state.

The counter 336 has an enable terminal connected to the output terminal of the AND gate 334 for receiving the control signal ($V_{CONTROL}$) and an input terminal connected to the shaping circuit 304 for receiving the clock signal ($V_{CLK}$). The counter 336 generates a clock ready signal ($V_{CLK\_RDY}$) that is indicative of stability and quality of the clock signal ($V_{CLK}$). The stability and the quality of the clock signal ($V_{CLK}$) refers to the condition when the parameters of the clock signal ($V_{CLK}$) such as amplitude and duty cycle are within respective threshold limits. The counter 336 generates the clock ready signal ($V_{CLK\_RDY}$) at logic high state after a pre-determined time period when the control signal ($V_{CONTROL}$) is at logic high state, thereby ensuring that a stable clock signal is provided to electronic circuits such as flip-flops, latches, processors, and data converters of an integrated circuit (IC). Thus, an incorrect detection of the stability and the quality of the clock signal ($V_{CLK}$) due to reasons such as, but not limited to, initial transition of the first signal ($V_1$) when the clock generator circuit 300 is powered on or power bouncing is avoided. The pre-determined time period is indicative of a programmed count value. In an embodiment of the present invention, the counter 336 is reset to an initial state when the control signal ($V_{CONTROL}$) is at logic low state. In another embodiment of the present invention, the counter 336 includes a built-in power-on-reset (POR) circuit for resetting the counter 336 to the initial state at power on.

In operation, when the clock generator circuit 300 is powered on, the diagnostic circuit 308 determines whether the duty cycle of the clock signal ($V_{CLK}$) is greater than 42.5% and less than 57.5% of the time period of the clock signal ($V_{CLK}$). When the duty cycle of the clock signal ($V_{CLK}$) is within the aforementioned limits, the first and second comparators 330 and 332 generate the first and second comparison signals ($V_{COMP\_1}$ and $V_{COMP\_2}$) at logic high state and the AND gate 334 generates the control signal ($V_{CONTROL}$) at logic high state thereafter. Thus, the first and second muxes 326 and 328 receive the control signal ($V_{CONTROL}$) at logic high state and hence, output the first and fourth voltage signals ($V_{VOL\_1}$ and $V_{VOL\_4}$) as first and second intermediate signals ($V_{INT\_1}$ and $V_{INT\_2}$), respectively. Thereafter, the diagnostic circuit 308 determines whether the duty cycle of the clock signal ($V_{CLK}$) is greater than 40% and less than 60% of the time period of the clock signal ($V_{CLK}$). The counter 336 receives the control signal ($V_{CONTROL}$) at logic high state and hence, starts counting the clock pulses of the clock signal ($V_{CLK}$). When the counter 336 completes counting up to the programmed count value, the counter 336 generates the clock ready signal ($V_{CLK\_RDY}$) at logic high state. Subsequently, the clock generator circuit 300 provides the clock signal ($V_{CLK}$) to electronic circuits of an integrated circuit (IC) containing the clock generator circuit 300. However, when the counter 336 does not complete counting up to the programmed count value and when the duty cycle of the clock signal ($V_{CLK}$) reduces below 40% or increases above 60%, the counter 336 is reset to the initial state and the AND gate 334 generates the control signal ($V_{CONTROL}$) at logic low state, thereby disabling the counter 336.

In an embodiment of the present invention, the diagnostic circuit 308 includes a combinational logic circuit (not shown) connected to the counter 336 and the shaping circuit 304 for receiving the clock ready signal ($V_{CLK\_RDY}$) and the clock signal ($V_{CLK}$), respectively. The combinational logic circuit outputs the clock signal ($V_{CLK}$) to the electronic circuits of the IC only when the clock ready signal ($V_{CLK\_RDY}$) is at logic high state.

Figure 4:
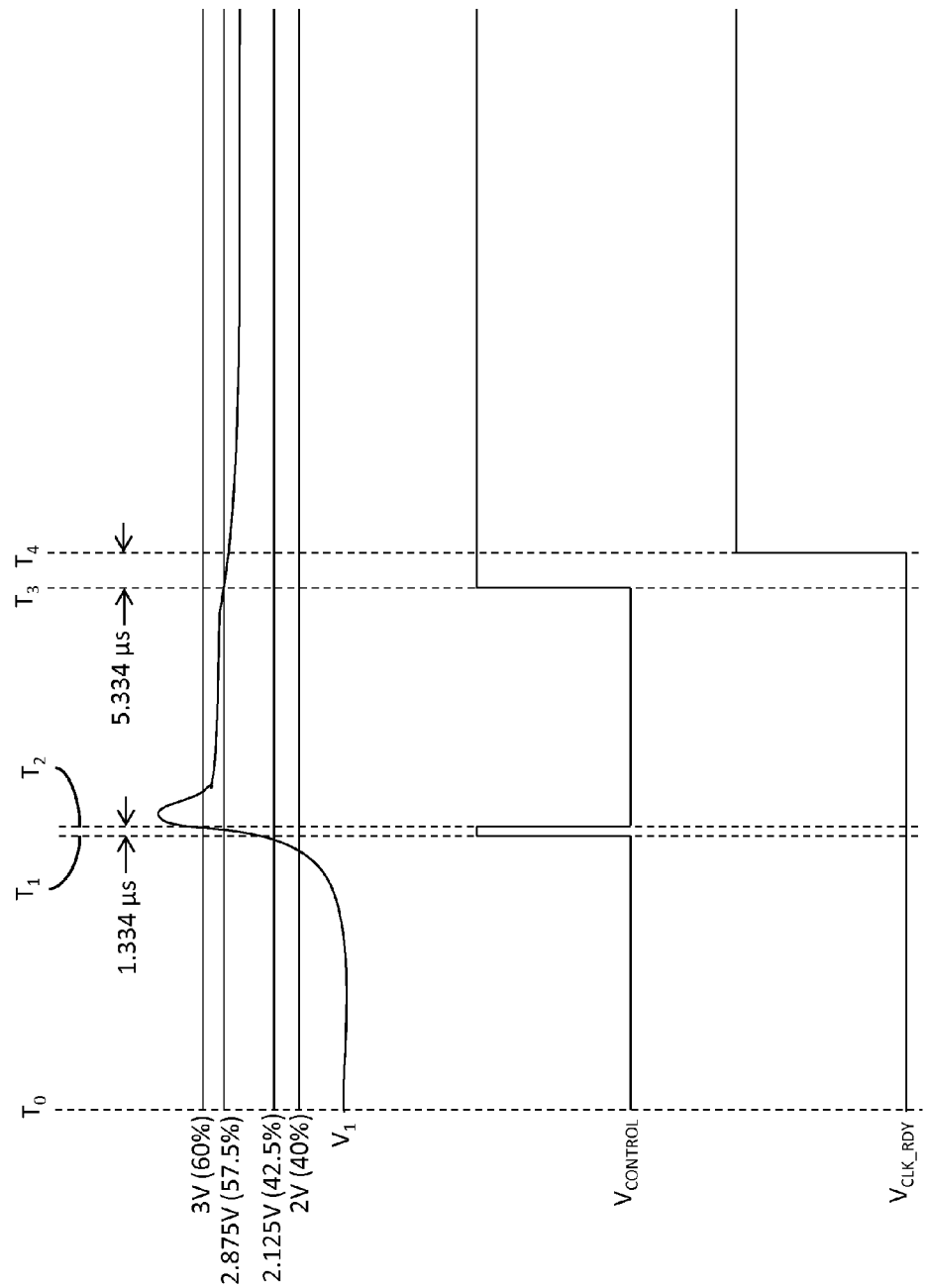
FIG. 4 is a timing diagram illustrating operation of the clock generator circuit of FIG. 3 in accordance with an embodiment of the present invention.

Referring now to FIG. 4, a timing diagram illustrating an operation of the clock generator circuit 300 in accordance with an embodiment of the present invention is shown. In an example, the first and second supply voltages ($V_{SS}$ and $V_{DD}$) are 0 volts (V) and 5V, respectively. The resistance values of the third through seventh resistors 338-346 are 160 kilo-ohms, 10 kilo-ohms, 60 kilo-ohms, 10 kilo-ohms, and 160 kilo-ohms, respectively. A voltage level of the first voltage signal ($V_{VOL\_1}$) is 3V, i.e., 60% of 5V. A voltage level of the second voltage signal ($V_{VOL\_2}$) is 2.875 V, i.e., 57.5% of 5V. A voltage level of the third voltage signal ($V_{VOL\_3}$) is 2.125V, i.e., 42.5% of 5V. A voltage level of the fourth voltage signal ($V_{VOL\_4}$) is 2V, i.e., 40% of 5V. The programmed count value for the counter 336 is 64. The oscillation source 312 generates the oscillating signal ($V_{OSC}$) at a frequency of 12 megahertz (MHz).

During time period $T_0$-$T_1$, the amplitude of the oscillating signal ($V_{OSC}$) begins to oscillate with increasing amplitude as the clock generator circuit 300 is powered on. The voltage level of the first signal ($V_1$) is less than 2.125V. The control signal ($V_{CONTROL}$) is at logic low state and hence, the first and second muxes 326 and 328 output the second and third voltage signals ($V_{VOL\_2}$ and $V_{VOL\_3}$) as the first and second intermediate signals ($V_{INT\_1}$ and $V_{INT\_2}$), respectively. The first and second comparators 330 and 332 generate the first and second comparison signals ($V_{COMP\_1}$ and $V_{COMP\_2}$) at logic high and logic low states, respectively. As the control signal ($V_{CONTROL}$) is at logic low state, the counter 336 is disabled. Thus, the clock ready signal ($V_{CLK\_RDY}$) is at logic low state.

At time instance $T_1$, the voltage level of the first signal ($V_1$) is slightly greater than 2.125V. The first and second muxes 326 and 328 output the second and third voltage signals ($V_{VOL\_2}$ and $V_{VOL\_3}$) as the first and second intermediate signals ($V_{INT\_1}$ and $V_{INT\_2}$), respectively. The first and second comparators 330 and 332 generate the first and second comparison signals ($V_{COMP\_1}$ and $V_{COMP\_2}$) at logic high state. Hence, the AND gate 334 generates the control signal ($V_{CONTROL}$) at logic high state. Thus, at time instance $T_1$, the logic state of the control signal ($V_{CONTROL}$) is changed from logic low state to logic high state. Thus, the counter 336 is enabled and starts counting the clock pulses of the clock signal ($V_{CLK}$). However, as the counter 336 does not complete counting up to the programmed count value, the counter 336 generates the clock ready signal ($V_{CLK\_RDY}$) at logic low state. Further, as the logic state of the control signal ($V_{CONTROL}$) is changed from logic low state to logic high state, the logic state of the signal that is received by the first and second muxes 326 and 328 at corresponding select terminals is changed from logic low state to logic high state.

During time period $T_1$-$T_2$, the voltage level of the first signal ($V_1$) is greater than 2V and less than 3V. The first and second muxes 326 and 328 output the first and fourth voltage signals ($V_{VOL\_1}$ and $V_{VOL\_4}$) as the first and second intermediate signals ($V_{INT\_1}$ and $V_{INT\_2}$), respectively. The first and second comparators 330 and 332 generate the first and second comparison signals ($V_{COMP\_1}$ and $V_{COMP\_2}$) at logic high state. Hence, the AND gate 334 generates the control signal ($V_{CONTROL}$) at logic high state, i.e., the logic state of the control signal ($V_{CONTROL}$) is retained. Thus, the counter 336 continues counting the clock pulses of the clock signal ($V_{CLK}$). As the time period $T_1$-$T_2$ is 1.334 microseconds (us), the counter 336 counts up to 16. As the counter 336 does not complete counting up to the programmed count value, i.e., 64, the counter 336 generates the clock ready signal ($V_{CLK\_RDY}$) at logic low state during the time period $T_1$-$T_2$.

Thus, during the time period $T_0$-$T_1$, as the voltage level of the first signal ($V_1$) is less than 2.125V, the diagnostic circuit 308 checks whether the duty cycle of the clock signal ($V_{CLK}$) is between 42.5% and 57.5% of the time period of the clock signal ($V_{CLK}$). The AND gate 334 generates the control signal ($V_{CONTROL}$) at logic low state. At time instance $T_1$, the voltage level of the first signal ($V_1$) is slightly greater than 2.125V. At time instance $T_1$, the diagnostic circuit 308 checks whether the duty cycle of the clock signal ($V_{CLK}$) is between 42.5% and 57.5% of the time period of the clock signal ($V_{CLK}$) as the control signal ($V_{CONTROL}$) was at logic low state at the end of time period $T_0$-$T_1$. Thus, the AND gate 334 generates the control signal ($V_{CONTROL}$) at logic high state at time instance $T_1$. As the logic state of the control signal ($V_{CONTROL}$) has changed from logic low state to high state at time instance $T_1$, the counter 336 is enabled and starts counting the clock pulses of the clock signal ($V_{CLK}$). As the control signal ($V_{CONTROL}$) is at logic high state and the counter 336 does not complete counting up to the programmed count value, the diagnostic circuit 308 checks whether the duty cycle of the clock signal ($V_{CLK}$) is between 40% and 60% of the time period of the clock signal ($V_{CLK}$) during the time period $T_1$-$T_2$. However, as the counter 336 does not complete counting up to the programmed count value, the counter 336 generates the clock ready signal ($V_{CLK\_RDY}$) at logic low state during the time period $T_1$-$T_2$.

At time instance 12, the voltage level of the first signal ($V_1$) is slightly greater than 3V. The first and second muxes 326 and 328 output the first and fourth voltage signals ($V_{VOL\_1}$ and $V_{VOL\_4}$) as the first and second intermediate signals ($V_{INT\_1}$ and $V_{INT\_2}$), respectively. The first and second comparators 330 and 332 generate the first and second comparison signals ($V_{COMP\_1}$ and $V_{COMP\_2}$) at logic low and logic high states, respectively. Hence, the AND gate 334 generates the control signal ($V_{CONTROL}$) at logic low state, i.e., the logic state of the control signal ($V_{CONTROL}$) is changed from logic high state to logic low state. Thus, the counter 336 is disabled and generates the clock ready signal ($V_{CLK\_RDY}$) at logic low state. Further, as the logic state of the control signal ($V_{CONTROL}$) is changed from logic high state to logic low state, the logic state of the signal that is received by the first and second muxes 326 and 328 at corresponding select terminals is changed from logic high state to logic low state.

During time period $T_2$-$T_3$, the voltage level of the first signal ($V_1$) is greater than 2.875V. The first and second muxes 326 and 328 output the second and third voltage signals ($V_{VOL\_2}$ and $V_{VOL\_3}$) as the first and second intermediate signals ($V_{INT\_1}$ and $V_{INT\_2}$), respectively. Hence, the first and second comparators 330 and 332 generate the first and second comparison signals ($V_{COMP\_1}$ and $V_{COMP\_2}$) at logic low and logic high states, respectively. The AND gate 334 generates the control signal ($V_{CONTROL}$) at logic low state, i.e., the logic state of the control signal ($V_{CONTROL}$) is retained. Thus, the counter 336 is disabled and hence, the counter 336 generates the clock ready signal ($V_{CLK\_RDY}$) at logic low state.

At time instance $T_3$, the voltage level of the first signal ($V_1$) is slightly less than 2.875V. The first and second muxes 326 and 328 output the second and third voltage signals ($V_{VOL\_2}$ and $V_{VOL\_3}$) as the first and second intermediate signals ($V_{INT\_1}$ and $V_{INT\_2}$), respectively. The first and second comparators 330 and 332 generate the first and second comparison signals ($V_{COMP\_1}$ and $V_{COMP\_2}$) at logic high state. Hence, the AND gate 334 generates the control signal ($V_{CONTROL}$) at logic high state, i.e., the logic state of the control signal ($V_{CONTROL}$) is changed from logic low state to logic high state. As the AND gate 334 generates the control signal ($V_{CONTROL}$) at logic high state, the counter 336 is enabled and starts counting the clock pulses of the clock signal ($V_{CLK}$). As the counter 336 has not completed counting up to the programmed the count value, the counter 336 generates the clock ready signal ($V_{CLK\_RDY}$) at logic low state.

Further, as the logic state of the control signal ($V_{CONTROL}$) is changed from logic low state to logic high state, the logic state of the signal received by the first and second muxes 326 and 328 at corresponding select terminals is changed from logic low state to logic high state.

During time period $T_3$-$T_4$, the voltage level of the first signal ($V_1$) is greater than 2V and less than 3V. The first and second muxes 326 and 328 output the first and fourth voltage signals ($V_{VOL\_1}$ and $V_{VOL\_4}$) as first and second intermediate signals ($V_{INT\_1}$ and $V_{INT\_2}$), respectively. Hence, the first and second comparators 330 and 332 generate the first and second comparison signals ($V_{COMP\_1}$ and $V_{COMP\_2}$) at logic high state. The AND gate 334 generates the control signal ($V_{CONTROL}$) at logic high state, i.e., the logic state of the AND gate 334 is retained. Thus, the counter 336 continues counting the clock pulses of the clock signal ($V_{CLK}$). As the time period $T_3$-$T_4$ is 5.334 microseconds (us), the counter 336 counts up to the programmed count value, i.e., 64. At time instance $T_4$, as the counter 336 completes counting up to the programmed count value, the counter 336 generates the clock ready signal ($V_{CLK\_RDY}$) at logic high state at time instance $T_4$.

Thus, at time instance $T_2$, the voltage level of the first signal ($V_1$) is greater than 3V. At time instance $T_2$, the diagnostic circuit 308 checks whether the duty cycle of the clock signal ($V_{CLK}$) is between 40% and 60% of the time period of the clock signal ($V_{CLK}$) as the logic state of the control signal ($V_{CONTROL}$) was at logic high state at the end of the of the time period $T_1$-$T_2$. However, at time instance $T_2$, as the voltage level of the first signal ($V_1$) is greater than 3V, the AND gate 334 generates the control signal ($V_{CONTROL}$) at logic low state, thereby disabling the counter 336. Thus, the counter 336 generates the clock ready signal ($V_{CLK\_RDY}$) at logic low state at time instance $T_2$. During the time period $T_2$-$T_3$, the voltage level of the first signal ($V_1$) is greater than 2.875V. During the time period $T_2$-$T_3$, the diagnostic circuit 308 checks whether the duty cycle of the clock signal ($V_{CLK}$) is between 42.5% and 57.5% of the time period of the clock signal ($V_{CLK}$) as the control signal ($V_{CONTROL}$) was at logic low state at time instance $T_2$. The AND gate 334 generates the clock signal ($V_{CLK}$) at logic low state, thereby disabling the counter 336. During the time period $T_2$-$T_3$, the clock ready signal ($V_{CLK\_RDY}$) is at logic low state as the counter 336 is disabled. At time instance $T_3$, the voltage level of the first signal ($V_1$) is slightly less than 2.875V. Thus, at time instance $T_3$, the diagnostic circuit 308 checks whether the duty cycle of the clock signal ($V_{CLK}$) is between 42.5% and 57.5% of the time period of the clock signal ($V_{CLK}$) as the control signal ($V_{CONTROL}$) was at logic low state at the end of the time period $T_2$-$T_3$. At time instance $T_3$, the AND gate 334 generates the control signal ($V_{CONTROL}$) at logic high state, thereby enabling the counter 336. The counter 336 starts counting the clock pulse of the clock signal ($V_{CLK}$). During the time period $T_3$-$T_4$, the voltage level of the first signal ($V_1$) is greater than 2V and less than 3V. Thus, the diagnostic circuit 308 checks whether the duty cycle of the clock signal ($V_{CLK}$) is between 40% and 60% of the time period of the clock signal ($V_{CLK}$) as the control signal ($V_{CONTROL}$) was at logic high state at time instance $T_3$. The counter 336 continues counting the clock pulses of the clock signal ($V_{CLK}$). At time instance $T_4$, the counter 336 completes counting up to the programmed count value, and generates the clock ready signal ($V_{CLK\_RDY}$) at logic state at time instance $T_4$.

The diagnostic circuit 308 does not directly perform any operation on the amplified signal ($V_{AMP}$). Rather, the diagnostic circuit 308 determines whether the duty cycle of the clock signal ($V_{CLK}$) is within required limit and hence, provides more accurate results. The control signal ($V_{CONTROL}$) is enabled when the duty cycle of the clock signal ($V_{CLK}$) is within the required limit. Further, the counter 336 counts the clock pulses of the clock signal ($V_{CLK}$) when the control signal ($V_{CONTROL}$) is enabled and generates the clock ready signal ($V_{CLK\_RDY}$) at logic high state after the predetermined time period corresponding to the programmed count value, thereby ensuring that the parameters corresponding to the characteristics of the clock signal ($V_{CLK}$) are within the respective limits. Thus, the time required to generate the clock ready signal ($V_{CLK\_RDY}$) to indicate the stability and the quality of the clock signal ($V_{CLK}$) is reduced for given process-voltage-temperature (PVT) conditions. Hence, the diagnostic circuit 308 provides a stable operation that is process corner independent.

It will be understood by those of skill in the art that the number of resistors in the resistor-ladder network 324 and the resistance values thereof may vary as per requirement. Further, the counter 336 may be programmed to count up to a desired count value by changing the programmed count value.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A clock generator circuit, comprising:
   an amplifier circuit that receives an oscillating signal and generates an amplified signal;
   a shaping circuit that receives and shapes the amplified signal, and generates the clock signal;
   a resistor-ladder network having a first input terminal connected to a first supply voltage and a second input terminal connected to a second supply voltage, wherein the resistor-ladder network includes first, second, third, and fourth voltage taps for outputting first, second, third, and fourth voltage signals, respectively;
   a first multiplexer connected to the first and second voltage taps for receiving the first and second voltage signals, respectively, a select terminal for receiving a control signal, and an output terminal for outputting a first intermediate signal;
   a second multiplexer connected to the fourth and third voltage taps for receiving the fourth and third voltage signals, respectively, a select terminal for receiving the control signal, and an output terminal for outputting a second intermediate signal;
   a first comparator that receives and compares the first intermediate signal and a first signal, and generates a first comparison signal, wherein the first signal is indicative of at least one of a direct current (DC) value of the clock signal and an average value of an amplitude of the clock signal;
   a second comparator that receives and compares the first signal and the second intermediate signal, and generates a second comparison signal;
   a logic gate having that receives the first and second comparison signals, and generates the control signal; and
   a counter having an enable terminal for receiving the control signal, a clock terminal for receiving the clock signal, and an output terminal for generating a clock ready signal based on the control signal, whereby the clock ready signal is indicative of stability and quality of the clock signal.

2. The clock generator circuit of claim 1, further comprising a low pass filter for receiving the clock signal and generating the first signal.

3. The clock generator circuit of claim 1, further comprising an oscillation source for generating the oscillating signal.

4. The clock generator circuit of claim 1, wherein the shaping circuit is further connected to an input of the amplifier circuit for receiving the oscillating signal.

5. The clock generator circuit of claim 1, wherein the first multiplexer outputs the second voltage signal as the first intermediate signal when the control signal is at a logic low state and outputs the first voltage signal as the first intermediate signal when the control signal is at a logic high state.

6. The clock generator circuit of claim 5, wherein the second multiplexer outputs the third voltage signal as the second intermediate signal when the control signal is at the logic low state and the fourth voltage signal as the second intermediate signal when the control signal is at the logic high state.

7. The clock generator circuit of claim 6, wherein the first comparison signal is in a logic high state when a voltage level of the first signal is less than a voltage level of the first intermediate signal.

8. The clock generator circuit of claim 7, wherein the second comparison signal is at a logic high state when the voltage level of the first signal is greater than a voltage level of the second intermediate signal.

9. The clock generator circuit of claim 1, wherein the logic gate is an AND gate.

10. The clock generator circuit of claim 1, wherein the counter generates the clock ready signal at a logic high state after a predetermined time period when the control signal is at a logic high state, wherein the predetermined time period is indicative of a programmed count value.

11. A clock generator circuit, comprising:
    an amplifier circuit having an input terminal for receiving an oscillating signal and an output terminal for generating an amplified signal;
    a shaping circuit connected to the amplifier circuit for receiving and shaping the amplified signal, and generating a clock signal;
    a low pass filter connected to the shaping circuit for receiving the clock signal and generating a first signal, wherein the first signal is indicative of at least one of a direct current (DC) value of the clock signal and an average value of an amplitude of the clock signal; and
    a diagnostic circuit, comprising:
       a resistor-ladder network having a first input terminal connected to a first supply voltage and a second input terminal connected to a second supply voltage, wherein the resistor-ladder network includes first, second, third, and fourth voltage taps for outputting first, second, third, and fourth voltage signals, respectively;
       a first multiplexer having first and second input terminals connected to the first and second voltage taps for receiving the first and second voltage signals, respectively, a select terminal for receiving a control signal, and an output terminal for outputting a first intermediate signal;

a second multiplexer having first and second input terminals connected to the fourth and third voltage taps for receiving the fourth and third voltage signals, respectively, a select terminal for receiving the control signal, and an output terminal for outputting a second intermediate signal;

a first comparator having a first input terminal connected to the output terminal of the first multiplexer for receiving the first intermediate signal, a second input terminal for receiving the first signal, and an output terminal for generating a first comparison signal;

a second comparator having a first input terminal for receiving the first signal, a second input terminal connected to the output terminal of the second multiplexer for receiving the second intermediate signal, and an output terminal for generating a second comparison signal;

a logic gate having first and second input terminals connected to the output terminals of the first and second comparators for receiving the first and second comparison signals, respectively, and an output terminal for generating the control signal; and a counter having an enable terminal for receiving the control signal, a clock terminal for receiving the clock signal, and an output terminal for generating a clock ready signal based on the control signal, whereby the clock ready signal is indicative of stability and quality of the clock signal.

12. The clock generator circuit of claim 11, further comprising an oscillation source for generating the oscillating signal.

13. The clock generator circuit of claim 11, wherein the first multiplexer outputs the second voltage signal as the first intermediate signal when the control signal is at logic low state and the first voltage signal as the first intermediate signal when the control signal is at logic high state.

14. The clock generator circuit of claim 13, wherein the second multiplexer outputs the third voltage signal as the second intermediate signal when the control signal is at logic low state and the fourth voltage signal as the second intermediate signal when the control signal is at logic high state.

15. The clock generator circuit of claim 14, wherein the first comparator generates the first comparison signal at logic high state when a voltage level of the first signal is less than a voltage level of the first intermediate signal.

16. The clock generator circuit of claim 15, wherein the second comparator generates the second comparison signal at logic high state when the voltage level of the first signal is greater than a voltage level of the second intermediate signal.

17. The clock generator circuit of claim 16, wherein the logic gate is an AND gate.

18. The clock generator circuit of claim 17, wherein the counter generates the clock ready signal at logic high state after a pre-determined time period when the control signal is at logic high state, and wherein the pre-determined time period is indicative of a programmed count value.

19. The clock generator circuit of claim 11, wherein the shaping circuit is further connected to the input terminal of the amplifier circuit for receiving the oscillating signal.

* * * * *